United States Patent [19]

Mueller et al.

[11] Patent Number: 4,884,237

[45] Date of Patent: Nov. 28, 1989

[54] STACKED DOUBLE DENSITY MEMORY MODULE USING INDUSTRY STANDARD MEMORY CHIPS

[75] Inventors: Wolfgang R. Mueller, Wappingers Falls; Gwynne W. Spencer, II, Poughkeepsie, both of N.Y.

[73] Assignee: International Business Machines Corporation, Armonk, N.Y.

[21] Appl. No.: 324,958

[22] Filed: Mar. 17, 1989

Related U.S. Application Data

[63] Continuation of Ser. No. 594,184, Mar. 28, 1984, abandoned.

[51] Int. Cl.$^4$ .......................... G11C 5/06; H01R 9/00; H05K 1/00
[52] U.S. Cl. .................................... 365/63; 365/52; 365/189.03; 361/413; 361/404; 439/69; 439/44
[58] Field of Search ............... 365/51, 52, 63, 189.03; 361/395, 404, 413, 412; 439/44, 69

[56] References Cited

U.S. PATENT DOCUMENTS

| | | | |
|---|---|---|---|
| 3,746,934 | 7/1973 | Stein | 361/420 |
| 4,018,494 | 4/1977 | Scheingold et al. | 439/330 |
| 4,030,793 | 6/1977 | Hanlon et al. | 339/18 C |
| 4,045,105 | 8/1977 | Lee et al. | 439/69 |
| 4,080,026 | 3/1978 | Gianni | 439/69 |
| 4,090,667 | 5/1978 | Crimmins | 339/18 C |
| 4,116,518 | 9/1978 | Pleskac | 439/69 |
| 4,116,519 | 9/1978 | Grabbe et al. | 439/69 |
| 4,192,565 | 3/1980 | Gianni | 439/69 |
| 4,312,555 | 1/1982 | Donaher et al. | 439/264 |
| 4,364,620 | 12/1982 | Mulholland et al. | 439/525 |
| 4,398,235 | 8/1983 | Lutz et al. | 361/396 |
| 4,406,508 | 9/1983 | Sadigh-Behzadi | 439/69 |

OTHER PUBLICATIONS

Gerson, "Package Piggybacks Standard EPROM to Emulate One Chip Microcomputer", Electronics, Jan. 31, 1980, pp. 89–92.
"The Challenge of Interconnection", B. T. Patterson, Circuits Manufacturing, Feb. 1981, pp. 22–31.
"Stacked Dip Socket", G. D. Christensen et al., T. & B. Ansley Corp., 13th Ann. Connector Symposium, Phila., Pa., 10/8-9, 1980, pp. 333–340.
IBM Specification A8279251, entitled "32K×1 Dynamic Ram", Aug. 9, 1978, pp. 1 and 11.
IBM Specification A4481832, entitled "128K×1 Dynamic RAM 16 Pin", Mar. 13, 1981, pp. 1 and 22.

Primary Examiner—Glenn A. Gossage
Attorney, Agent, or Firm—M. Bigel; D. Lashmitt; S. Meyers

[57] ABSTRACT

A stacked double density memory module may be formed from two industry standard memory chips, by jumpering the unused and chip enable pins on one chip and then stacking the jumpered chip on the other chip with the pins on the jumpered (top) chip contacting the corresponding pins on the other (bottom) chip except for the chip select pins. In a preferred embodiment for use with 64K or one megabit DRAMs, the top chip is jumpered with a U-shaped strap which runs from the unused pin to the chip enable pin. The chip enable pin is bent toward the chip body to retain the strap in place. The technique may also be employed for stacking other industry standard memory or array chips.

33 Claims, 1 Drawing Sheet

STACKED DOUBLE DENSITY MEMORY MODULE USING INDUSTRY STANDARD MEMORY CHIPS

This application is a continuation of application Ser. No. 594,184, filed Mar. 28, 1984 now abandoned.

BACKGROUND OF THE INVENTION

1. Technical Field

This invention relates to semiconductor memories or arrays and more particularly to a stacked double density memory module which uses industry standard memory chips.

Integrated circuit semiconductor memory chips are widely employed in data processing systems ranging from inexpensive home or personal computers to large mainframe systems. Integrated circuit memory chips, hereinafter referred to as memory chips or chips, comprise a packaged (encapsulated) semiconductor memory array, provided with a plurality of input/output pins. Presently, read/write memory chips, also referred to as Dynamic Random Access Memories (DRAMs), are available from many suppliers worldwide. The package dimensions and pin assignments for all memory chips having the same bit storage capacity are standardized, so that memory chips of the same bit storage capacity are interchangeable, regardless of the supplier.

One commonly used memory chip is the 64K DRAM. The 64K DRAM stores approximately 65,000 bits of data and is widely available in dual-in-line plastic, ceramic or plastic/ceramic packages. Regardless of the supplier, all 64K DRAMs are interchangeable in that the package dimensions and pin assignments are standardized. In particular, the industry standard 64K DRAM is available in a 16 pin package having the following pin assignments (with the pins being numbered counterclockwise from the upper left corner of the chip):

| Pin Number(s) | Pin Function |
| --- | --- |
| 1 | No connect - unused |
| 2 | Data Input |
| 3 | Write Enable |
| 4 | Row Address Select-Chip Enable |
| 5-7, 9-13 | Address |
| 8, 16 | Power Supply |
| 14 | Data Output |
| 15 | Column Address Select |

2. Background Art

In the quest for ever increasing storage density, computer designers have realized that stacked memory chips may be employed to double the storage density on a given printed circuit board. More particularly, since corresponding address, power supply, and data lines may be paralleled, two memory chips can be physically stacked upon one another with the bottom chip mounted on a printed circuit board or other second level package. Separate chip enable pin locations must be provided for each chip in order to select either the top or bottom chip. When stacked memory modules are employed, the memory storage density per printed circuit board unit area is effectively doubled. With this advantage in mind, the art has employed two basic approaches for stacking memory chips while still providing separate chip select pin locations for the top and bottom chips:

1. Larger Printed Circuit Board Footprint: Since two chip select paths are required at every stacked chip location on the circuit board, the chip select pins from the upper and lower chips may be routed to two separate printed circuit board locations. Thus, for example, two standard 16 pin 64K DRAMs may be mounted in an 18 pin socket, with the socket providing separate wiring paths for the chip enable pins from the top and bottom chips. Such an approach clearly wastes printed circuit board space because an 18 pin footprint is required for stacking two 16 pin chips. Moreover, a connector or housing for mounting the stacked DRAMs is generally required in order to provide the wiring paths from 16 pins to 18 pins. A connector or housing also wastes space on the printed circuit board, increases cost, and decreases the reliability of the stacked module, thereby offsetting some of the advantages of stacked chips.

2. Customized Pin Assignments: The pin assignments of one or both of the chips may be rearranged from the industry standard to permit stacking. Thus, for example, in the 64K DRAM industry standard pin assignment, pin 1 is a no-connect (unused) pin and pin 4 is the row address select (chip enable) pin. Customized 64K DRAM chips may be procured wherein pin 1 is the row address select (chip enable) pin and pin 4 is a no-connect (unused) pin. Then, an industry standard and customized 64K DRAM may be stacked. While such an approach does provide a 16 pin footprint on the printed circuit board, it will be understood that customized chips are much more expensive than industry standard chips because they are not available as off-the-shelf items. Accordingly, the increased cost of the non-standard chip offsets some of the advantage of stacked chips.

In conclusion, although the 64K DRAM is widely used in personal, mini, and mainframe computers, and in non-computer oriented products such as video games, it has not been heretofore recognized that two 64K DRAMs may be stacked to obtain a double density memory module, without increasing the printed circuit board footprint size, without requiring the use of a socket or housing and without requiring customized pin assignments.

SUMMARY OF THE INVENTION

It is therefore an object of the invention to provide a stacked double density memory module which uses the same size printed circuit board footprint as that of the individual chips.

It is another object of the invention to provide a stacked double density memory module which may be directly mounted on a printed circuit board, multilayer ceramic substrate or other second level package, without a connector or housing.

It is yet another object of the invention to provide a stacked double density memory module which employs two industry standard integrated circuit memory chips.

It is still another object of the invention to provide a method of stacking industry standard memory chips in a manner that is amenable to high volume manufacturing.

These and other objects are realized by a stacked double density memory module which comprises two industry standard chips each of which includes a no-connect (unused) pin and a chip enable (select) pin. The no-connect and chip enable pins on the top chip are electrically jumpered. The chip select pin on the top chip is bent, or the end of the chip select pin is removed, so that the chip select pin on the top chip does not touch the chip select pin on the bottom chip when the two chips are stacked.

The jumpered (top) chip is then stacked on the bottom chip with each pin on the top chip contacting the corresponding pin on the bottom chip, except for the chip select pins. The bottom chip may be mounted on a printed circuit board or other second level package. Accordingly, for the stacked memory module, the industry standard no-connect pin position becomes the top chip select pin position. The bottom chip select pin position is the industry standard chip select pin position.

For the 64K DRAM described above, pins 1 (no-connect) and 4 (row address select) on the top chip are jumpered, and pin 4 is either bent or the end thereof is cut off. The chips are stacked with all pins touching except pins 4. For the stacked memory module, pin 1 becomes the top chip select while pin 4 becomes the bottom chip select.

In a preferred embodiment of the invention, for 64K DRAMs, the row/address select pin, (pin 4) and the no-connect pin (pin 1) are jumpered by means of a metal U-shaped strap. Each end of the U-strap has a hole therein, and the dimensions of the U-strap are such that pins 1 and 4 fit into a respective one of the holes, with the body of the U-strap running along the body of the chip. After placement of the U-strap, pin 4 is bent toward the body of the chip to hold the U-strap in place. The upper chip is then placed on top of the lower chip and the assembly is dip or wave soldered in a conventional manner. The soldering process also solders the U-strap to pins 1 and 4.

The above described double density memory module, and the above described process for fabricating the module permits industry standard 16 pin 64K DRAMs to be stacked in a 16 pin integrated circuit board footprint. A housing or connector is not needed. The individual process steps are conventional and the process adds little cost over the combined cost of the two 64K DRAMs. A double density memory module may thus be realized with insignificant cost or reliability impact.

It will be recognized by those having skill in the art that the invention may be employed for stacking any DRAM chip, the industry standard pin assignment of which includes a no-connect pin. Accordingly, the invention may be employed with one megabit DRAMs, which have an 18 pin industry standard pin assignment including a no-connect pin. The invention may also be employed with any read/write or read only memory chip, as long as the industry standard pin assignment includes a no-connect pin. Accordingly, the invention may be employed for stacking static RAMs, ROMs (read only memories), PROMs (programmable read only memories) and EPROMs (eraseable programmable read only memories). It will also be recognized that the invention may be applied to stack other array chips, e.g., programmable logic array chips, as long as the industry standard chip pin assignment includes a chip select pin and a no-connect pin.

Indeed, it will be recognized that the stacked chips need not be identical chips, as long as both industry standard chips include a chip select pin and a no-connect pin, and the function of each pin position is the same on both chips (i.e., the same pin positions are employed for address, power supply, data, enable and the no-connect functions). Thus, for example, a ROM and a PROM may be stacked according to the invention. The stacked chips need not even have the same footprint size, as long as both chips include a chip select pin and a no-connect pin, and the function of each overlapping pin position is the same on both chips.

It will also be recognized that jumpering techniques other than as described above may be employed. For example, a C, V or other shaped strap may be employed. Alternatively, the strap may be replaced by a wire wrap connecting the chip enable and no-connect pins. It will also be recognized that the jumper may be incorporated into a housing or connector to provide easy removability of the chips if desired.

DETAILED DESCRIPTION OF THE INVENTION

Figure 1:
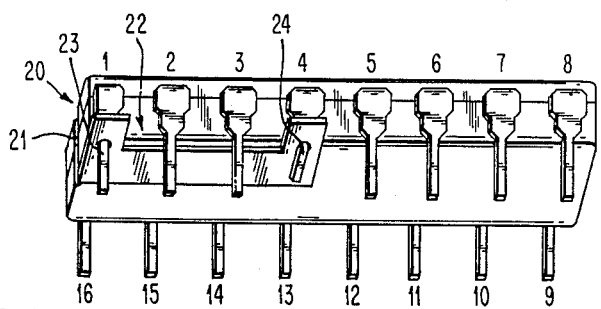
FIG. 1 illustrates a preferred embodiment of the top chip of a stacked 64K DRAM module according to the present invention.

Referring now to FIG. 1, the top chip of a stacked module according to the present invention is illustrated. Top 64K DRAM chip 20 includes pins 1–16 which are labelled with reference to notch 21 according to the industry standard pin assignment outlined above. In the industry standard pin assignment, pin 1 is a no-connect, i.e., an unused pin, and pin 4 is the row address select pin which is the chip enable for the 64K DRAM. According to the invention, pins 1 and 4 are jumpered. As shown in FIG. 1, the jumper is a U-shaped metal strap 22 having holes 23 and 24 at respective ends thereof. The dimensions of U-strap 22 are such that holes 23 and 24 are aligned with pins 1 and 4, respectively. After the U-strap is inserted on pins 1 and 4 as shown, pin 4 is bent toward the DRAM body as shown, in order to ensure that pin 4 does not touch corresponding pin 4 of the bottom chip when the chips are stacked, and also to ensure that U-strap 22 is held in place. In a preferred embodiment, U-strap 22 is tin plated brass to provide compatibility with the tin plated chip pins and with conventional lead-tin solders.

It will be recognized by those having skill in the art that strap 22 may be in the shape of a C (semicircle), V or other shape, and that the strap may be placed on pins 1 and 4 so that the body thereof runs along the side or top of chip 20. It will also be understood by those having skill in the art that strap 22 need not include holes 23 and 24. Rather, the ends of the strap may be abutted against pins 1 and 4 and pin 4 may be bent to hold the strap in place. Glue may also be employed to retain the strap in place against the chip prior to soldering.

It will also be recognized that rather than bending pin 4, the end thereof may be cut to ensure that it does not touch corresponding pin 4 of the lower chip when the chips are stacked. If pin 4 is cut rather than bent, glue may be employed to retain strap 22 in place. Finally, it will also be understood that a conductive wire may be wrapped around pin 1, routed underneath or on top of chip 20, and wrapped around pin 4 to provide the requisite jumpering.

Figure 2:
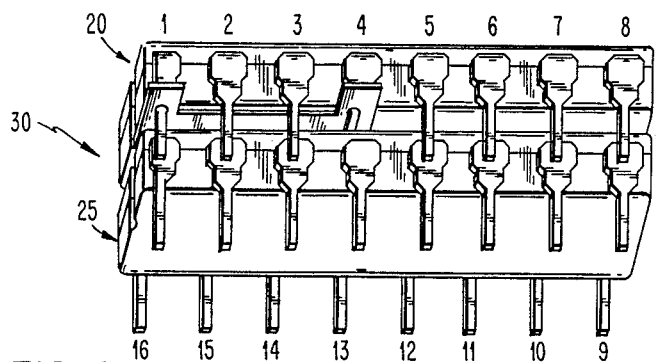
FIG. 2 illustrates a preferred embodiment of a stacked double density 64K DRAM module according to the present invention.

Referring now to FIG. 2, there is illustrated a stacked double density module 30 according to the present invention. Module 30 provides 128K bits of storage. Top chip 20 is placed on bottom chip 25 so that the pins on top chip 20 touch corresponding pins on bottom chip 25, except for row address select pin 4. Module 30 may then be dip soldered or wave soldered in a conventional manner. The soldering process also solders the conductive U-strap to pins 1 and 4. It will be understood by those having skill in the art that if a conductive strap without holes is abutted against pins 1 and 4 on top chip 20, a high temperature solder process may first be employed to solder the strap to pins 1 and 4. Then the upper chip 20 and lower chip 25 may be stacked and soldered together using a low temperature solder process, thus ensuring that the strap is not disturbed.

It will also be understood that rather than soldering, an electrical connector or housing may be provided for mounting chips 20 and 25 therein. The housing may also include a built in jumper for electrically connecting pins 1 and 4 on top chip 20. Such a housing provides easy removability of the chips, at the expense of reliability and packaging density.

Figure 3:
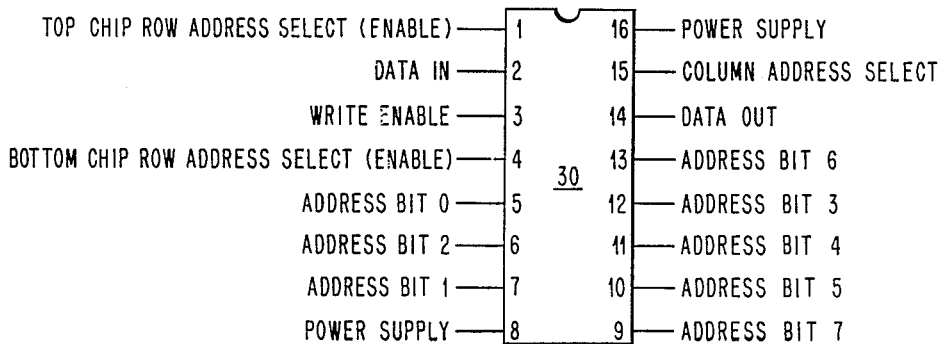
FIG. 3 illustrates the pin assignment of the stacked double density memory module of FIG. 2.

FIG. 3 illustrates the pin assignments for the 128K stacked memory module 30 according to the present invention. The pin assignments correspond to the industry standard 64K DRAM pin assignments, except that pin 1 is now the top chip row address select (chip enable) pin while pin 4 is the bottom chip row address select (chip enable) pin. The module no longer includes a no-connect pin position. The module may be mounted on a printed circuit board or other second level package in a conventional manner, with separate signal lines being routed to top chip row address select pin position 1 and bottom chip row address select pin position 4.

It will be understood by those having skill in the art, that the word "chip", as used herein, refers to one or more pieces of semiconductor material which comprise a memory array, encapsulated or packaged in plastic, ceramic or other material and provided with a plurality of input/output pins. The word "module", as used herein, refers to two chips stacked according to the present invention. It will be noted that other references sometimes use the words IC (integrated circuit), LSI (large scale integrated circuit), DIP (dual-in-line package), or module, as synonymous for the word "chip" as used herein, and use the word chip to refer to the semiconductor material itself.

While the invention has been particularly shown and described with reference to a preferred embodiment thereof, it will be understood by those skilled in the art that various changes in form and details may be made without departing from the spirit and scope of the invention.

We claim:

1. A method of forming a stacked double density memory module from first and second industry standard memory chips, each of which includes a plurality of address, power supply and data pins, a chip select pin and an unused pin, in the same pin positions on said first and second chips, comprising the steps of:
   placing a conductive strap on said first chip extending from the chip select pin to the unused pin thereon; and
   mounting said first chip on top of said second chip with the pins on said first chip directly contacting the corresponding pins on said second chip, except for the chip select pins.

2. The method of claim 1 wherein said first and second industry standard memory chips are read only memory chips.

3. The method of claim 1 wherein said first and second industry standard memory chips are programmable read only memory chips.

4. The method of claim 1 wherein said first and second industry standard memory chips are erasable programmable read only memory chips.

5. The method of claim 1 wherein said first and second industry standard memory chips are programmable logic array chips.

6. The method of claim 1 wherein said first and second industry standard memory chips do not have the same number of pins, the plurality of address, power supply, data, chip select and unused pins being at the same pin positions on said first and second chips to the extent that the pin positions overlap.

7. The method of claim 1 further comprising the step of placing the second chip on a second level package.

8. The method of claim 1 wherein said placing step comprises the step of:
   placing a conductive strap having a hole at both ends thereof, along the bottom surface of said top chip, with the chip select pin extending through one hole and the unused pin extending through the other hole.

9. The method of claim 8 wherein said mounting step comprises the steps of:
   bending the chip select pin on said top chip toward the bottom of said chip so that it retains said conductive strap in place; and
   mounting said first chip on top of said second chip.

10. The method of claims 8 wherein said conductive strap is a wire.

11. The method of claim 1 wherein said first and second industry standard memory chips are 64K RAMs.

12. The method of claim 1 wherein said first and second industry standard memory chips are one megabit RAMs.

13. The method of claims 11 or 12 wherein said chip select pin is the row address pin and wherein the unused pin is the no-connect pin.

14. A method of forming a stacked double density memory module from first and second identical industry standard memory chips, each of which includes a plurality of address, power supply and data pins, a chip select pin and an unused pin, comprising the steps of:
   placing a metal U-shaped strap, having holes at both ends thereof, along the bottom surface of said first chip, with the chip select pin extending through one hole and the unused pin extending through the other hole;
   bending the chip select pin in said first chip toward the bottom surface of said first chip to retain said metal U-shaped strap in place;
   mounting the first chip on top of said second chip, with each pin on said first chip contacting the corresponding pin on said second chip except for the chip select pins; and,
   soldering the contacting pins on said first and second chips to one another and soldering the metal U-shaped strap to the chip select pin and the unused pin on said first chip.

15. The method of claim 14 wherein said first and second identical industry standard memory chips are 64K RAM chips, with the unused pin being a no-connect pin and the chip select pin being a row address select pin.

16. The method of claim 14 further comprising the step of mounting the second chip on a second level package.

17. A double density memory module comprising:
first and second industry standard memory chips, each of which includes a plurality of address, power supply and data pins, a chip select pin and an unused pin, in the same pin positions on said first and second chips, with the pins on said first chip directly connected to the corresponding pins on said second chip, except for said chip select pins; and
a conductive strap connecting said chip select pin and said unused pin on said first chip.

18. The double density memory module of claim 17 wherein the chip select pin in said first chip is bent toward the first chip, so that the chip select pin on said first chip does not contact the chip select pin on said second chip.

19. The double density memory module of claim 17 wherein the end of the chip select pin on said first chip is removed so that the chip select pin on said first chip does not contact the chip select pin on said second chip.

20. The double density memory module of claim 17 wherein the pins on said first and second chip are soldered together.

21. The double density memory module of claim 17 wherein said first and second industry standard memory chips are 64K RAMs.

22. The double density memory module of claim 17 wherein said first and second industry standard memory chips are one megabit RAMs.

23. The double density memory module of claim 17 wherein said first and second industry standard memory chips are read only memory chips.

24. The double density memory module of claim 17 wherein said first and second industry standard memory chips are programmable read only memory chips.

25. The double density memory module of claim 17 wherein said first and second industry standard memory chips are erasable programmable read only memory chips.

26. The double density memory module of claim 17 wherein said first and second industry standard memory chips are programmable logic array chips.

27. The double density memory module of claim 17 wherein said first and second industry standard memory chips do not have the same number of pins; the plurality of address, power supply, data, chip select and unused pins being in the same pin positions on said first and second chips to the extent that the pin positions overlap.

28. The double density memory module of claim 13 wherein said strap has a hole at each end thereof, with the chip select pin extending through the hole at one end and the unused pin extending through the hole at the other end.

29. The double density memory module of claim 28 wherein said strap is generally U-shaped.

30. A double density memory module comprising:
first and second identical industry standard memory chips, each of which includes a plurality of address, power supply and data pins, a chip select pin and an unused pin, said first chip being mounted on top of said second chip so that each pin on said first chip is in electrical contact with the corresponding pin on said second chip, except for said chip select pins; and,
a metal U-shaped strap, having a hole at both ends thereof, mounted along the bottom of said first chip, with the unused pin extending through one hole in said strap and the chip select pin extending through the other hole in said strap, the chip select pin on said first chip being bent towards the bottom of said first chip to retain said strap in place.

31. The double density memory module of claim 30 wherein said first and second chips are 64K RAM chips, with the unused pin being a no-connect pin and the chip select pin being a row address select pin.

32. The double density memory module of claim 30 wherein said first and second chips are one megabit RAM chips, with the unused pin being a no-connect pin and the chip select pin being a row address select pin.

33. The double density memory module of claim 30 wherein said second chip is mounted on a printed circuit board.

* * * * *